United States Patent
Goerigk

(12) 
(10) Patent No.: US 6,303,398 B1
(45) Date of Patent: Oct. 16, 2001

(54) METHOD AND SYSTEM OF MANAGING WAFERS IN A SEMICONDUCTOR DEVICE PRODUCTION FACILITY

(75) Inventor: Peter Goerigk, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/564,211

(22) Filed: May 4, 2000

(51) Int. Cl.[7] .................................................. G01R 31/26
(52) U.S. Cl. ................................. 438/14; 438/15
(58) Field of Search ............................... 438/14, 15, 17; 29/722

(56) References Cited

U.S. PATENT DOCUMENTS

| | | | |
|---|---|---|---|
| 5,112,641 | * | 5/1992 | Harada et al. . |
| 5,443,346 | | 8/1995 | Murata et al. .................. 414/222 |
| 5,537,325 | * | 7/1996 | Iwakiri et al. . |
| 5,654,204 | * | 8/1997 | Anderson . |
| 5,884,392 | * | 3/1999 | Lafond . |
| 5,889,674 | | 3/1999 | Burdick et al. .................. 364/468.28 |

FOREIGN PATENT DOCUMENTS 0 684 631 A1    11/1995    (EP) ............................... H01L/21/00

OTHER PUBLICATIONS

Hank Hogan, "300mm Theory and Practice," www.cleanrooms.com, Mar. 2000.

* cited by examiner

*Primary Examiner*—Caridad Everhart
(74) *Attorney, Agent, or Firm*—Williams, Morgan & Amerson, P.C.

(57) ABSTRACT

A method and a system is provided to automatically manage wafers in a semiconductor device production facility. Wafers to be processed in a clean room are automatically identified, tracked and sorted on a single wafer basis. By means of a wafer attribute information, including the unique position data and the entirety of a specific treatment to which the wafer is subjected, the processing of each wafer is controlled without the necessity to place wafers of respective lots in a single wafer cassette.

25 Claims, 2 Drawing Sheets

METHOD AND SYSTEM OF MANAGING WAFERS IN A SEMICONDUCTOR DEVICE PRODUCTION FACILITY

BACKGROUND OF THE INVENTION

1. Field of the Invention

The present invention relates to a method and a system of managing wafers in a semiconductor device-producing facility and, more particularly, to automatically tracking, identifying and sorting the wafers.

2. Description of the Related Art

The manufacture of semiconductor devices requires a number of discrete process steps to create a packaged semiconductor circuit device from a semiconductor substrate, which is usually provided as a semiconductor wafer. The semiconductor manufacturer fabricates semiconductor circuit devices, e.g., microprocessors, DRAMs, ASICs (application specific ICs) on individual wafers, usually forming a number of devices on each wafer. The individual fabrication processes include photolithography, ion implantation, etching, deposition, and other associated fabrication processes known in the art.

Typically, selected semiconductor devices formed on a specified wafer, herein referred to as a measurement wafer, are used for measuring device characteristics during and after the fabrication process, thereby monitoring the quality of the manufacturing process. Moreover, test wafers are introduced into the various fabrication processes to control and properly adjust process parameters of these steps. In addition, further types of wafers are generally used, referred to as dummy wafers, which are required to balance the number of wafers in a specific process step when a varying number of wafers to be processed would otherwise lead to varying process constraints in the process step.

Another important factor in manufacturing high quality semiconductor devices with associated large production yields is to avoid contamination of the wafers to be processed with any type of particles. As the human being is one of the most significant sources of contaminating particles, the entire manufacturing process takes place in a clean room in an attempt to reduce the number of environmental particles. Moreover, all procedural steps, including the provision of the wafers to the various process stations, is, as far as possible, automated, thereby reducing the presence of a human operator to a minimum.

In present semiconductor fabrication facilities, computer-aided manufacturing systems (CAM systems) control the fabrication process and provide information regarding operating conditions during these processes. Generally, the wafers undergo a specific treatment or process flow, i.e., the entirety of procedural steps necessary for forming a specific semiconductor device such as applying photoresist, irradiating the wafer with exposure light, developing the resist and etching the wafer, etc., to produce the desired device on the wafer. The wafers are generally stored in a single wafer cassette and are routed through the corresponding process stations to perform the desired process steps. One or more wafers to be subjected to a specific treatment form a specific lot of wafers. When the specific treatment is completed, a control unit, which may be implemented in a CAM system, instructs an operator or an automated transport system to transport the corresponding wafer cassette containing said lot of wafers, or at least a part of said wafer lot, to a new starting point for another process sequence or operation.

In order to maintain high product quality, by continuously controlling the efficiency of the various processes, it is inevitable to add dummy or test wafers to a specific lot of wafers. Since present CAM systems do not distinguish single wafers, but merely track individual wafer cassettes and wafer lots, respectively, it is not possible to automatically constitute specific test-wafer assemblies and measurement wafer assemblies, wherein single test wafers or measurement wafers of different wafer lots are finally grouped together in order to obtain the desired information regarding the various process steps. Moreover, each process sequence for manufacturing a certain semiconductor device is assigned to an individual wafer lot contained in a single cassette, i.e., even if a single wafer has to be subjected to a specific process sequence, an entire wafer cassette has to be employed, thereby wasting the remaining space of the wafer cassette and thus leading to a reduced throughput if a plurality of small wafer lots has to be processed.

Since the demand for ASICs has recently increased, the semiconductor manufacturers have to deal with a large variety of different devices and, accordingly, with different processes, wherein the number of pieces is often small, the number of wafers manufactured per lot may accordingly be relatively low. As a consequence, a large amount of the production capacity of the semiconductor manufacturing facility is wasted, owing to the limited ability of a conventional CAM system to control the wafer flow through the facility merely on a single cassette basis. Furthermore, the presence of wafers to be processed according to differing design demands requires the existence of a variety of test and dummy wafer assemblies within the production line which, in turn, need to be processed in separate cassettes, thereby additionally reducing the throughput of product wafers. Similarly, manufacturing of semiconductor devices using cutting edge technology requires extensive testing and controlling of test wafers as well as of a portion of the product wafers, i.e., the measurement wafers, in order to achieve a high product yield in combination with a predetermined quality standard. In the conventional CAM system, however, the flexible and automated handling of product wafers and test wafers and monitoring test results on a single wafer basis is not possible.

The present invention is directed to a method of making a semiconductor device that solves, or at least reduces, some or all of the aforementioned problems.

SUMMARY OF THE INVENTION

The present invention is directed to a system and method for managing wafers in a semiconductor device production facility. In one illustrative embodiment, the method is comprised of providing a wafer control system, and providing a wafer in a wafer cassette having a cassette identifier. The method further comprises determining the wafer cassette identifier, determining a slot number of a slot in the wafer cassette in which the wafer is located, communicating the slot number and the wafer cassette identifier to the wafer control system, and storing the slot number and the wafer cassette identifier in the wafer control system as part of a wafer attribute information.

In one illustrative embodiment, the system is comprised of a control unit in communication with a memory unit, a terminal that allows access to the information stored in the memory unit, and a wafer sorter in communication with the control unit and adapted for placing a wafer in a cassette in accordance with a unique wafer position information. The system further comprises a means for reading the cassette identifier, a means for determining the slot number of a cassette, the slot number and cassette identifier being communicated to the control unit, wherein the control unit stores the slot number and cassette identifier in the memory unit.

BRIEF DESCRIPTION OF THE DRAWINGS

The invention may be understood by reference to the following description taken in conjunction with the accompanying drawings, in which like reference numerals identify like elements, and in which.

Figure 1:
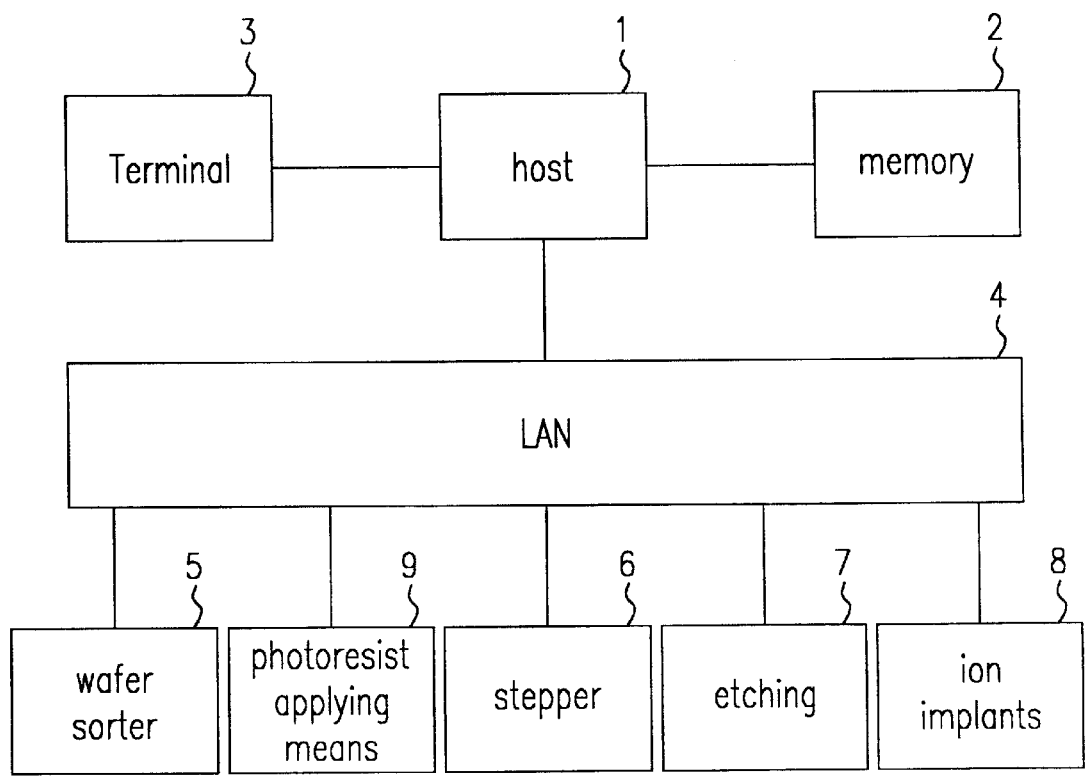
FIG. 1 is a block diagram schematically showing the structure of a system according to one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–4. In general, the present invention is directed to a method of managing wafers in a semiconductor device production facility. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

FIG. 1 is a block diagram which schematically depicts an illustrative wafer control system 30 according to one embodiment of the present invention. In FIG. 1, reference sign 1 indicates a host computer, which may be any type of computer having sufficient computing capacity, e.g., a personal computer, a workstation, a portable computer, a microprocessor, etc. The host computer 1 is connected to a memory unit 2, which may be incorporated into the host computer 1. The memory unit 2 may be comprised of any type of device capable of storing data or information, e.g., memory chips, disk drives, tape drives, etc. A data managing system (not shown) may be installed in the host computer 1 for selectively accessing the memory unit 2. A terminal 3 is connected to the host computer 1 to allow an operator to communicate with the host computer 1. Alternatively, the terminal 3 may be an interface communicating with associated data processing equipment.

The host computer 1 is connected to a local area network (LAN) 4, which, in turn, is connected to a wafer sorter 5 and to various process stations, such as resist applying station 9, wafer stepper 6, etching station 7 and ion implanter 8. Each of the process stations 6 to 9, as well as wafer sorter 5, is provided with a mechanical interface (not shown) which is able to input wafers from a wafer cassette (not shown) supplied to the processing stations, and to output the wafers processed in the process stations to a wafer cassette. These mechanical interfaces may be those suggested by standards setting organizations, such as SEMI. The various process stations also have devices or systems for determining the wafer cassette identifiers (to be described more fully below) of the cassette supplied to the processor system. In one embodiment, the mechanical interfaces are able to recognize the cassette identifiers of the wafer cassette supplied to the mechanical interfaces.

In one embodiment, the wafer sorter 5 is further equipped with an optical recognition system (not shown) which allows the reading and recognition of an identification mark (described below) which has been applied to each wafer 11 to be processed in the production line. The wafers to be processed may be supplied to the various stations 6–9 by a human operator. Alternatively, wafers may be supplied to some or all of the stations 6–9 by an automated conveying system (not shown).

Figure 2:
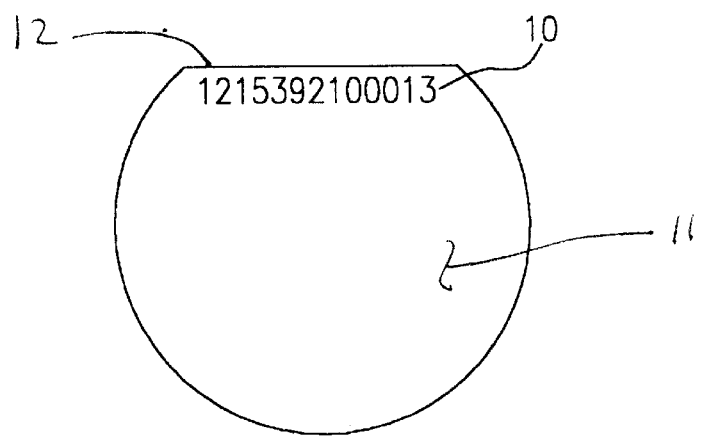
FIG. 2 is a plan view of a semiconductor wafer used in an illustrative embodiment of the present invention.

The system shown in FIG. 1 will be described in its operational status with reference to FIGS. 1–4. The wafer sorter 5 is supplied with semiconductor wafers 11, each having a wafer identification mark 10 near a defined position. For example, the identification mark 10 may be placed near a notch or a flat 12 of the wafer 11 as is shown in FIG. 2. In one embodiment, the wafer identification mark 10 consists of a 13 digit number which may contain a variety of information, such as the serial number of the wafer, type of dopant of the wafer, etc. The identification mark 10 may contain any desired information, and it may take any form that is readable by a machine or computer, e.g., a bar code, character strings, etc.

Figure 3:
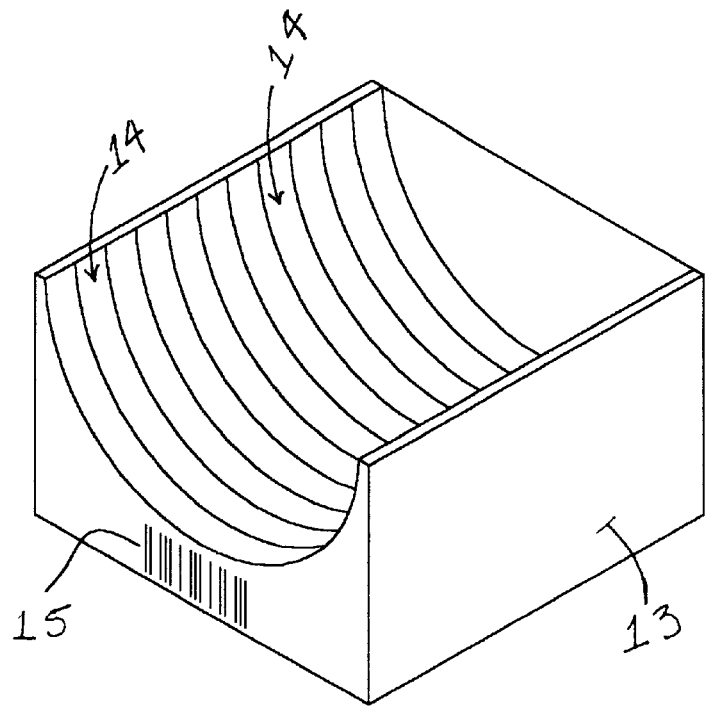
FIG. 3 is a schematic side view of a wafer cassette.

The wafers 11 supplied to wafer sorter 5 may be fresh wafers, which are newly introduced in the production process, or they may be wafers 11 which have been subjected to several procedural steps and which need to be regrouped. The wafers 11 are provided in a wafer cassette 13, as shown in FIG. 3, having a cassette identifier 15 which can be read by the recognition system associated with the process stations and/or the mechanical interfaces of the process stations. The cassette identifier 15 may take any form that is readable by a machine or computer, e.g., a bar code, etc.

Usually, the wafer cassette 13 may be designed so as to have slots 14 to receive, for example, 25 or 50 wafers. Each slot 14 of the cassette 13 may be uniquely identified by the wafer sorter 5 and/or the various stations 6–9 by a variety of techniques. For example, using standardized cassettes 13, the cassette handling mechanism (not shown) associated with the wafer sorter 5 or stations 6–9 can determine which particular slot 14 a wafer 11 is removed from or inserted into. For example, the wafer cassettes 13 are typically standard size cassettes with a set number of slots 14 that are adapted to receive the wafers 11. Given the standard size of the cassette, the process station, e.g., the mechanical interface, can determine the particular slot number for any given slot. This is typically accomplished by incrementing or decrementing the cassette up or down one slot at a time. Using an appropriate reference point, the particular slot of the cassette that is in position to receive or unload a wafer may be determined. As with the other identification marks discussed above, the slot identification mark 16 may take any form that may be readable by a machine or computer, e.g., a bar code, etc.

In the wafer sorter 5, the identification mark 10 is read by the optical recognition system (not shown) and is communicated to the host computer 1 via the local area network 4. Concurrently, the cassette identifier 15 and the slot number of the slot 14 housing the wafer 11 to be handled are transmitted to the host computer 1; wafer identification mark 10, cassette identifier 15 and the slot number 14 of the cassette 13 are stored in the memory unit 2 as part of a wafer attribute information characterizing the wafer 11 under consideration.

The wafer attribute information may also comprise information about the specific treatment of the wafer 11. Accordingly, previous "events" as well as future "events" of the wafer's "career," such as certain measurement procedures to be performed when the wafer 11 is specified as a measurement wafer, are monitored. The stored wafer attribute information may be accessed by, for example, a computer program controlling the operation of the entire production line, or by an operator via the terminal 3, when an update of the attribute information is required. If, for example, a wafer 11 needs to be split off of a specific wafer lot, the host computer 1 may instruct the wafer sorter 5 to place the wafer 11 into the new position specified by the instructions received via the terminal 3 or a software program run in the host computer 1. The new position, i.e., the new cassette identifier and slot number, are then stored as the updated unique position information for the wafer 11. Preferably, another request for a position alteration of the wafer 11 is delayed or rejected until the initial request has been carried out.

After one or more wafers 11 have been placed in the wafer cassette 13 in accordance with the process requirements, the cassette 13 is transported to the corresponding process station 6–9. In the specific process station, the wafers 11 are transferred into the process station via the mechanical interface and are re-transferred to a cassette 13 after completion of the specific process. In this embodiment, the host computer 1 is informed by the process station about the completion of the process and this information is added to the wafer attribute information in order to monitor the "history" of the wafer 11. Of course, the cassette into which the completed wafers are loaded may be the same cassette from which the wafers were removed, or it may be a different cassette. If a different cassette is used, the wafer control system 30 may have to be updated as to the cassette identifier 15 of the new cassette.

Figure 4:
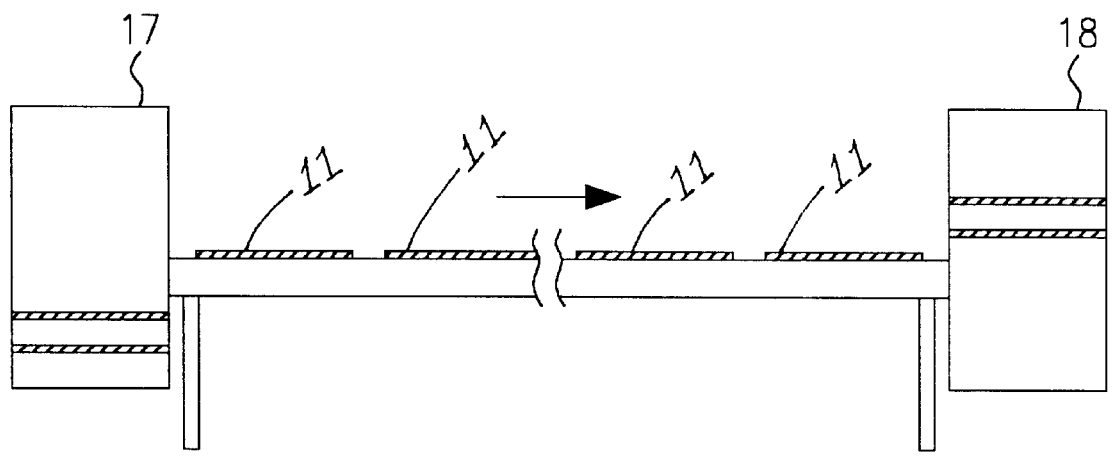
FIG. 4 is a schematic side view of an illustrative process station used in the system according to one embodiment of the present invention.

FIG. 4 shows an example of a resist-applying station 9 in which the initial position of the wafer 11 is not maintained after completing the process since two different wafer cassettes 17, 18 take part in loading and unloading the resist-applying station. An initial cassette 17 with wafers 11 to be processed is supplied to an input side of the resist-applying station 9 and an empty cassette 18 is provided at the output side of the station 9. In one embodiment of the present invention, wafers 11 are transported from the cassette 17 to the cassette 18 in such a manner that the slot number of respective wafers 11 is maintained. After completion of the process, i.e., after filling the cassette 18 with the wafers of initial cassette 17, the cassette identifier of cassette 18 is communicated to the host computer 1 and the wafer attribute information of the respective wafers 11 is accordingly updated. Furthermore, the process station 9 may communicate process parameters and test results to the control unit, thereby completing the wafer attribute information.

Due to the above-described system, a large number of wafers 11, which may be members of different lots, can be processed either under control of an appropriate instruction method executed by the wafer control system 30, e.g., by the host computer 1, a peripheral processor unit, or under the control of an operator via the terminal 3. Moreover, the wafer attribute information may be changed in order to, for example, merge or split wafer lots, or to add or remove dummy wafers or test wafers to specific wafer lots. For example, based upon this wafer attribute information, the processing operations performed on individual wafers may be varied, e.g., different polish times for different wafers within the same lot.

In one embodiment, the host computer 1 compares the changed wafer attribute information for a specific wafer 11 with the wafer attribute information of wafers present in the production line, and determines whether the new position requested is available or not. In this embodiment, the cassette 13 housing the wafer 11 for which a new position is requested is transported to the wafer sorter 5 after the current process for each wafer in the cassette has been completed. If the wafer cassette 13 including the new position of the wafer 11 is not immediately available, because the current process of its wafers has not yet been completed, the wafer 11 may be transferred to an intermediate position, the cassette identifier 15 and slot number of which are stored as the updated unique position information, as long as the requested position is ultimately reached.

In this manner, the method and the system in accordance with the present invention allows the automatic merging and splitting of wafer lots with different attribute information. For example, it may be desirable to perform subsequent processing operations on wafers depending upon the thickness of incoming layers. In that, wafers having a process layer of a given thickness range may be segregated by the thickness for further processing. As a consequence, process equipment qualification can be performed by using test wafer assemblies which consist of different test wafer types in a single cassette. Furthermore, dummy wafers can be added, tracked and removed automatically within product lots in accordance with specific process equipment, i.e., chemical mechanical polishing (CMP) equipment which processes batches of wafers. One use of the present invention is to take test wafers for different process at the same equipment, and modify testing based upon wafer attribute information. As a further advantage of the present invention, multiple lots of small quantities of wafers can be placed into a single cassette, thereby saving cassettes, storing space capacity and material handling resources.

Moreover, the unique wafer position information of specific wafers may be particularly updated so as to consume minimum wafer management resources. Since the wafer attribute information contains indications for the complete treatment of a wafer, particularly indications for following processes with respect to any arbitrary time during the wafer's presence in the production line, the present invention allows for the splitting of a wafer lot without losing the ability to control the further processing of the lot. Therefore, it is also possible to optimize the throughput of specific wafer lots in that the retention time of these wafer lots within the production line is minimized by accordingly updating the unique wafer position information. For this purpose, the type, number and time period for the various processes of the wafer lot are estimated. Additionally, the required test and dummy wafer assemblies are determined in advance. On this basis, the control unit calculates the optimal wafer position and the required alteration of these positions to achieve, for instance, minimum waste of cassette resources, or maximum throughput. The method and system can further be used to track wafers with special attribute information throughout the manufacturing line or portions thereof. This ensures that measurement data is always taken from the same wafers, thereby significantly improving the statistical monitoring and evaluation of the manufacturing process.

In the illustrative embodiment described above, the system comprises an optical recognition system for reading identification marks on wafers 11. This ensures stability of the system and the method since the actual position of a specific wafer 11 may be compared with its attribute information when the cassette 13 housing the specific wafer 11 is supplied to the wafer sorter 5 during the various process steps. It is, however, also possible to perform the method of the present invention without providing an optical recognition system and performing the wafer management completely on the basis of the unique position information, i.e., cassette identifier 15 and slot number of the wafers 11.

According to the present invention, there is provided a method of managing wafers in a clean room of a semiconductor device-producing facility, comprising the steps of: providing a control unit connected to a memory unit, a terminal for communicating with the control unit, a wafer sorter for placing wafers in a wafer cassette, identifier reading means for reading wafer cassette identifiers and determining a slot number of a slot in a wafer cassette occupied by a wafer, and a communication network connected to the control unit; providing a wafer and a wafer cassette, the wafer cassette having a cassette identifier; determining a slot number of a slot of the wafer cassette in which the wafer is located, communicating the slot number and the cassette identifier to the control unit via the communication network, and storing the slot number and the cassette identifier as part of wafer attribute information in the storage means, thereby generating unique position information for the wafer.

According to the present invention, attribute information containing the position of a wafer to be processed is assigned to each wafer and stored in a memory unit which is accessible by an operator via a terminal and an instruction set in the control unit. Accordingly, each wafer may be checked and identified during the manufacturing process even if different wafer lots are handled in a single wafer cassette. In this way, the throughput may remarkably be increased. Preferably, the wafer attribute information further contains indications for the specific treatment of the wafer to thereby determine, at any given time, the already performed process steps as well as the future process steps required for completing the semiconductor device.

In a particularly illustrative embodiment of the present invention, the method further comprises the steps of: marking the wafer with an identification mark prior to the step of providing the wafer, providing a recognition system for reading the identification mark, and assigning the identification mark red by the recognition system to the wafer attribute information. The additional provision of a hardware mark on the wafer ensures increased process security, since the unique position information for each wafer stored in the memory unit may be compared to the actual wafer position indicated by the cassette identifier, the slot number, and the identification mark of the wafer.

The method disclosed herein further comprises: accessing the wafer attribute information, allowing an alteration of the wafer attribute information, wherein the previous wafer attribute information is preserved, and causing the wafer sorter to place the wafer indicated by the previous wafer attribute information in an updated position in accordance with the altered wafer attribute information, when the unique position information of the wafer is different in at least one of the slot number and the cassette identifier of the altered wafer attribute information, and storing the slot number and the cassette identifier as part of the wafer attribute information in the memory unit, thereby updating the unique position information for the wafer. According to this embodiment, the position of the wafer may be changed in accordance with process requirements, wherein the unique position information is brought into conformity with the new current position of the wafer. The wafer attribute information may contain information as to whether the wafer is one of a test wafer, a dummy wafer, or a measurement wafer. By this measure, it is easy to automatically track and remove test wafers within certain product lots, as is required for specific processing equipment, i.e. chemical mechanical polishing equipment, wherein batches of wafers are processed.

The wafer attribute information of the present invention may be accessed by an operator via the terminal, thereby facilitating the tracking of a certain wafer throughout the manufacturing process. Alternatively, the wafer attribute information may be accessed via the communication network, thereby providing the possibility for a plurality of operators or external devices such as CAM systems to control the wafer management. In one embodiment, the communication network is a global network. This provides for the possibility to communicate the wafer attribute information to remote locations, when, for example, the fabrication process is performed in separate facilities.

Using the present invention, a plurality of process stations may be connected to the control unit via the communication network, wherein each process station has a mechanical interface for supplying wafers from and to a wafer cassette. Thus, the connected processing stations may add additional information to the wafer attribute information which relates to the process which the wafer has undergone in the respective process stations. This measure provides for the possibility of monitoring the manufacturing process in more detail, thereby considerably contributing to an increased production yield. For example, each process station may update the unique position information of the wafer according to the current slot number and wafer cassette identifier when the current slot number and wafer cassette identifier are different from the unique position information after completion of a process in said process station. In this way, the unique wafer position information is maintained when, for example, the incoming wafers of a specific process are not transferred to the identical wafer cassette even though the process has been completed.

In another illustrative embodiment, the control unit determines whether a change of the attribute information via the terminal is acceptable or not on the basis of the wafer attribute information of a plurality of wafers. According to this embodiment, the control unit may communicate to an operator accessing a specific wafer attribute information via the terminal that a requested alteration of the attribute information is not acceptable since, for instance, certain wafer positions requested by the operator are not available. The control unit may cause the cassette containing a wafer for which an alteration of the wafer attribute information requested is accepted, to be transported to the wafer sorter after finishing the current process step. Accordingly, wafers in the production line may be resorted in accordance with process requirements, or one or more wafers may be split off or merged to the lot. The control unit may also update the unique wafer position information of the wafer on the basis of attribute information stored in the memory unit and regroups the wafers so as to achieve minimum retention time of the wafer in the production line. Thus, the wafer position is determined in conformity with the position information and attribute information of other wafers which are present in the production line so that a high throughput may be achieved even if a plurality of different wafer lots has to be processed concurrently. The control unit may also be used to update the unique wafer position information of the wafer on the basis of attribute information stored in the memory unit and regroup the wafer so as to require minimal transport resources for the wafer. Accordingly, it is no longer necessary to process wafer lots in separate cassettes, and the capacity of each wafer cassette may be fully used.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a wafer control system;
   providing a wafer in a wafer cassette, the wafer cassette having a cassette identifier and a plurality of slots, each of said slots having a slot identification mark;
   determining the wafer cassette identifier of the wafer cassette;
   determining a slot number of a slot in the wafer cassette in which the wafer is located by reading said slot identification mark through use of an optical recognition system;
   communicating the slot number and the wafer cassette identifier to the wafer control system; and
   storing the slot number and the wafer cassette identifier in the wafer control system as part of a wafer attribute information.

2. The method of claim 1, wherein providing a wafer control system comprises providing a wafer control system comprised of:
   a control unit connected to a memory unit, said memory unit adapted for storing said wafer attribute information; and
   a terminal unit connected to said control unit, said terminal unit allowing communication with said control unit.

3. The method of claim 2, further comprising:
   providing a wafer sorter for placing wafers in a cassette;
   providing a recognition system for determining a wafer cassette identifier; and
   a communication network connected to said control system for sending information to said control system regarding said wafer cassette identifier and said slot number.

4. The method of claim 1, wherein providing a wafer in a wafer cassette, the wafer cassette having a cassette identifier, comprises providing a wafer in a wafer cassette, the wafer cassette having a cassette identifier comprised of a bar code.

5. The method of claim 1, wherein determining the wafer cassette identifier of the wafer cassette comprises determining the wafer cassette identifier of the wafer cassette through use of an optical recognition system.

6. A method of managing wafers in a clean room of a semiconductor device-producing facility, comprising the steps of:
   providing a wafer control system comprised of a control unit connected to a memory unit, a terminal for communicating with the control unit, a wafer sorter for placing wafers in a wafer cassette, a reading means for reading a wafer cassette identifier, a means for determining a slot number of a slot in a wafer cassette occupied by a wafer, and a communication network connected to the control unit;
   providing a wafer in a wafer cassette, the wafer cassette having a cassette identifier and a plurality of slots, each of said slots having a slot identification mark;
   determining a slot number of a slot of the wafer cassette in which the wafer is located by reading said slot identification mark through use of an optical recognition system;
   communicating the slot number and the cassette identifier to the control unit via the communication network; and
   storing the slot number and the cassette identifier as part of wafer attribute information in the memory unit, thereby generating unique position information for the wafer.

7. The method of claim 6, further comprising:
   marking the wafer with an identification mark prior to the step of providing the wafer;
   providing recognition means reading the identification mark on the wafer; and
   assigning the identification mark read by the recognition means to the wafer attribute information.

8. The method of claim 6, further comprising:
   accessing the wafer attribute information;
   altering the wafer attribute information, wherein the previous wafer attribute information is preserved;
   causing the wafer sorter to place the wafer indicated by the previous wafer attribute information in a different position in accordance with the altered wafer a tribute information when the unique position information of the wafer is different in at least one of the slot number and the cassette identifier of the changed wafer attribute information; and
   storing the slot number and the cassette identifier as part of the wafer attribute information in the memory unit, thereby updating the unique position information for the wafer.

9. The method of claim 8, wherein the wafer attribute information is accessed by an operator via the terminal.

10. The method of claim 8, wherein the wafer attribute information is accessed via the communication network.

11. The method of claim 8, wherein the communication network is a global network.

12. The method of claim 6, wherein the wafer attribute information contains information whether the wafer is one of a test wafer, a dummy wafer, and a measurement wafer.

13. The method of claim 6, wherein a plurality of process stations is connected to the control unit via the communication network, each process station having a mechanical interface for supplying wafers from and to wafer cassettes.

14. The method of claim 13, wherein each process station updates the unique position information of the wafer according to the current slot number and wafer cassette identifier when the current slot number and wafer cassette identifier are different from the unique position information after completion of a process in said process station.

15. The method of claim 8, wherein the control unit determines whether or not an alteration of the attribute information is acceptable on the basis of the wafer attribute information of a plurality of wafers.

16. The method of claim 15, wherein the control unit causes the cassette containing a wafer, for which an alteration of the wafer attribute information requested is accepted, to be transported to the wafer sorter after finishing the current process step.

17. The method of claim 8, wherein the control unit updates the unique position information of the wafer on the basis of attribute information stored in the memory unit and regroups the wafer so as to achieve minimum retention time of the wafer in the process line.

18. The method of claim 6, wherein the control unit updates the unique position information of the wafer on the basis of attribute information stored in the memory unit and regroups the wafer so as to require minimum transport resources for the wafer.

19. The method of claim 12, wherein the process stations communicate process parameters as additional attribute information for a specific wafer to the control unit when a corresponding process step for the specific wafer is completed.

20. A system for managing wafers in a clean room of a semiconductor device-manufacturing facility, comprising:

a control unit in communication with a memory unit and a terminal, the terminal adapted for allowing access to information stored in the memory unit;

a wafer sorter in communication with the control unit via a communication network, the wafer sorter adapted for placing a wafer in a cassette in accordance with a unique wafer position information communicated from the control unit, the cassette having a cassette identifier and a plurality of slots, each of said slots having a slot identification mark;

cassette identifier reading means reading the cassette identifier from a cassette, the identifier reading means communicating the identifier to the control unit via the communication network;

slot identification mark reading means comprised of an optical recigbutuib system for reading the slot identification mark from said cassette, the slot identification mark reading means communicating the slot identification mark to the controller via the communication network; and wherein the control unit is adapted to store the wafer attribute information in the memory unit, the cassette identifier and slot identification mark being part of the wafer attribute information as the unique wafer position information.

21. The system of claim 20, further comprising recognition means for reading an identification mark on the wafer, the recognition means being in communication with the control unit.

22. The system of claim 20, further comprising a plurality of process stations, each having a mechanical interface allowing supply of wafers from a cassette, each process station connected to the control unit via the communication network.

23. The system of claim 20, wherein the communication network is a global network.

24. The system of claim 12, wherein the wafer attribute information defines a type of test to be performed.

25. The system of claim 12, wherein the wafer attribute information defines a type of measurement to be performed.

* * * * *